United States Patent
Borwick et al.

(10) Patent No.: US 7,538,032 B2
(45) Date of Patent: May 26, 2009

(54) LOW TEMPERATURE METHOD FOR FABRICATING HIGH-ASPECT RATIO VIAS AND DEVICES FABRICATED BY SAID METHOD

(75) Inventors: Robert L. Borwick, Thousand Oaks, CA (US); Philip A. Stupar, Oxnard, CA (US); Jeffrey F. DeNatale, Thousand Oaks, CA (US); Chailun Tsai, Thousand Oaks, CA (US); Zhimin J. Yao, Thousand Oaks, CA (US); Kathleen Garrett, Woodland Hills, CA (US); John White, Lancaster, CA (US); Les Warren, Thousand Oaks, CA (US); Morgan Tench, Camarillo, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 171 days.

(21) Appl. No.: 11/167,014

(22) Filed: Jun. 23, 2005

(65) Prior Publication Data
US 2006/0292866 A1 Dec. 28, 2006

(51) Int. Cl.
*H01L 21/44* (2006.01)
(52) U.S. Cl. ............... 438/667; 257/E23.067
(58) Field of Classification Search ........... 438/638, 438/641, 643, 644, 678, 681, 686, 687, 667, 438/668; 257/E23.067, E21.577, E21.578
See application file for complete search history.

(56) References Cited

U.S. PATENT DOCUMENTS

| | | | |
|---|---|---|---|
| 4,855,017 A | 8/1989 | Douglas | 156/643 |
| 4,961,821 A | 10/1990 | Drake et al. | 156/747 |
| 5,421,083 A | 6/1995 | Suppelsa et al. | 29/852 |
| 5,501,893 A | 3/1996 | Laermer et al. | 428/161 |
| 6,278,181 B1 | 8/2001 | Maley | 257/712 |
| 6,458,615 B1 | 10/2002 | Fedder et al. | 438/50 |
| 6,565,730 B2 | 5/2003 | Chakravorty et al. | 205/122 |
| 6,716,737 B2 | 4/2004 | Plas et al. | 438/612 |

(Continued)

FOREIGN PATENT DOCUMENTS

EP 096723 A1 6/1999

(Continued)

OTHER PUBLICATIONS

Semiconductor Equipment Assessment, Results Bulletin, Microsystems Production Evaluated STS Aspects Silicon Etch Cluster Tool, available online at: http://www.sea.rl.ac.uk/NewSEA/newpubs/microspect/microspect_results.pdf.

(Continued)

*Primary Examiner*—Brook Kebede
(74) *Attorney, Agent, or Firm*—Koppel, Patrick, Heybl & Dawson

(57) ABSTRACT

Embodiments of the present invention are directed to a process for forming small diameter vias at low temperatures. In preferred embodiments, through-substrate vias are fabricated by forming a through-substrate via; and depositing conductive material into the via by means of a flowing solution plating technique, wherein the conductive material releases a gas that pushes the conductive material through the via to facilitate plating the via with the conductive material. In preferred embodiments, the fabrication of the substrate is conducted at low temperatures.

20 Claims, 5 Drawing Sheets

U.S. PATENT DOCUMENTS

| | | | |
|---|---|---|---|
| 6,717,071 B2 | 4/2004 | Chang et al. | 174/266 |
| 6,852,627 B2 | 2/2005 | Sinha et al. | 438/687 |
| 6,960,479 B2 | 11/2005 | Li et al. | 438/3 |
| 6,960,495 B2 | 11/2005 | Vyvoda | 438/131 |
| 6,963,483 B2 | 11/2005 | Chakravorty et al. | 361/306.3 |
| 6,968,110 B2 | 11/2005 | Patel et al. | 385/131 |
| 6,984,561 B2 | 1/2006 | Herner et al. | 438/257 |
| 6,995,072 B2 | 2/2006 | Walker et al. | 438/400 |
| 2002/0134581 A1* | 9/2002 | Figueroa et al. | 174/260 |
| 2003/0003724 A1 | 1/2003 | Uchiyama et al. | 438/667 |
| 2003/0104649 A1 | 6/2003 | Ozgur et al. | |
| 2004/0069529 A1 | 4/2004 | Oggioni et al. | |
| 2004/0119166 A1* | 6/2004 | Sunohara | 257/758 |
| 2004/0166688 A1 | 8/2004 | Xie et al. | |
| 2005/0093048 A1 | 5/2005 | Griffiths | |
| 2005/0093049 A1 | 5/2005 | Kundalgurki et al. | |
| 2005/0099762 A1* | 5/2005 | Wermer et al. | 361/500 |
| 2005/0287760 A1 | 12/2005 | Yan et al. | |
| 2006/0003566 A1 | 1/2006 | Emesh | |

FOREIGN PATENT DOCUMENTS

| | | |
|---|---|---|
| WO | WO8302368 A1 | 7/1983 |
| WO | WO 9908318 A1 * | 2/1999 |

OTHER PUBLICATIONS

Eisenbraun, et al., 3D Integration—The Packaging Technology for Tomorrow's Performance Needs, Chip 9, Unaxis Semiconductors, (Sep. 2003), pp. 14-17.

Liu, C., Progress in MEMS and Micro Systems Research, IMAPs/Acers 1st International Conference And Exhibition on Ceramic Interconnect And Ceramic Microsystems Technologies (CICMT), Baltimore Marriott Waterfront Hotel, Baltimore MD, (Apr. 10-13, 2005).

Pham, N. et al., IC-Compatible Two-Level Bulk Micromachining Process Module for RF Silicon Technology, IEEE Transactions on Electron Devices, vol. 48, No. 8, (Aug. 2001), pp. 1756-1764.

George, S. M. et al., Surface Chemistry for Atomic Layer Growth, J. Phys. Chem., vol. 100, No. 31, 1996, pp. 13121-13131.

* cited by examiner

LOW TEMPERATURE METHOD FOR FABRICATING HIGH-ASPECT RATIO VIAS AND DEVICES FABRICATED BY SAID METHOD

GOVERNMENT RIGHTS

This invention was made with Government support under Navy Contract No. N66001-02-C-8043 awarded by the Defense Advanced Research Projects Agency (DARPA). The Government has certain rights in this invention.

FIELD OF THE INVENTION

This invention is directed to a method for fabricating high-aspect ratio through-wafer vias. In particular, embodiments of the invention are directed to methods for the low temperature fabrication of through-wafer vias having small diameters. The invention is also directed to devices fabricated using such methods.

BACKGROUND

The fabrication of integrated circuit chips has become a sophisticated process that can allow complex circuitry to be densely packaged onto a single wafer, also known as a substrate. Originally, most chips were fabricated in a simple planar design. As the need for greater density of circuitry on a single substrate grew, the early simple planar chip designs proved inadequate. Indeed, the planar designs limited the amount of circuitry that could be placed on a single substrate, and further limited the implementation of multi-technology circuits such as Si CMOS and SiGe, or integrated device circuits such as a MEMS device and a related control circuit.

To overcome some of the limitations resulting from the planar design, designers began stacking chips to form three-dimensional designs. Vias extending through the wafer create three-dimensional interconnects which facilitate connection to the circuitry throughout the chip, thereby allowing the implementation of more advanced circuits and device architectures, and increasing the computing capacity of the chip. For example, three-dimensional designs increase the physical space available on the chip, thereby allowing a higher density of complex circuitry to be placed within a given die area. Furthermore, a three-dimensional design with through-wafer vias can enable advanced micro-electronic chip stacking or the stacking of various types of micro-components directly onto the chip. Multiple components on a single chip allow, for example, increased processing of image data and signal processing.

Although three-dimensional chips using through-wafer vias have proven useful, they are currently limited. In one approach, through-wafer vias have been formed in thick substrates. At thicknesses in excess of 200-400 microns, the wafers retain mechanical durability and can be easily handled and processed without the need for sequential stacking and thinning operations. In the thick wafer approach, wafers are etched and the formed vias are electrically insulated and metalized. Once the vias have been formed and metalized, the three-dimensional circuits are assembled by stacking (either at wafer-level or die-level).

Although this approach provides some advantages, for example, the ability to process the circuit layers in parallel, test for functionality, and assemble the 3D stack in an efficient manner, and addresses the mechanical integrity of the wafer, it introduces other limitations. In particular, one limitation is the inability to fabricate small-diameter, fine-pitch vias. Indeed, due to current etching techniques, the formation of high-aspect ratio (ratio of depth to diameter) vias results in a large diameter-to-pitch (pitch is the center to center measurement between vias) ratio for the vias. This limits the etch depth of the vias, and also reduces the amount of available space on the wafer for other uses. Current techniques typically produce vias having diameters of about 4 µm with a depth of about 20 µm (low temperature techniques) and 100 µm diameters with a depth of about 500 µm (high temperatures techniques), rendering an aspect ratio of about 1:5 for both high temperature and low temperature techniques. Both dry etching and wet etching have been demonstrated for the thick wafer processing, and both suffer from constraints on via size and separation. In addition, it is very difficult to reliably deposit electrical isolation layers and metallic conductors using low process temperature in the high aspect ratio vias. In current systems the larger diameter vias are tolerated as ensuring the deposition of conformal isolation and conductive layers becomes increasingly difficult with smaller diameter vias.

To reduce the vias diameters, some techniques stack, bond and thin multiple wafers into a 'single' wafer and form the vias through only a single thin layer of the stacked wafers at a time, thereby reducing the aspect ratio and diameter required of an individual via. This approach involves wafer thinning to reduce the required etch depth, and hence enable smaller via diameters to be achieved. In this approach, two wafers to be stacked are bonded and one portion (top or bottom) of the stacked wafers is thinned. The thinning requires a significantly reduced thickness of the wafer (typically 10-25 µm). At this thickness, vias can be etched through the thinned layer while maintaining small diameter and small separation between neighboring vias. Alternatively, the via could be etched to a limited depth prior to the bonding, and then its bottom surface exposed in the thinning operation after bonding. In either process, the reduced layer thickness is necessary due to the aspect ratio limitations of the etch process. The advantages of this approach include the ability to use well-developed fabrication processes. However, disadvantages arise from the need for sequential processing of each successive layer and the complexity of intermediate testing. Further, although this allows for via depth greater than one wafer, the thinning of the stacked wafers reduces their integrity and makes them more susceptible to breakage during use and damage from handling. Further still, many current bonding techniques involve high temperatures, high voltage and/or high pressure. Each of these poses difficulties if the stacking includes prefabricated integrated circuits with multi-level interconnects as the process could damage the circuitry.

Furthermore, many current via fabrication techniques, such as thermal oxidation and polysilicon deposition, are performed at high temperatures because conformal depositions, such as the insulation or conductive layers, require higher temperatures for successful deposition into the vias. However, these higher temperature processes cannot be used for circuit wafers, such as CMOS, as the higher temperatures can damage or destroy the circuitry. Rather, these techniques are generally limited to microelectromechanical system ("MEMS") applications without integrated circuitry. For circuitry applications, to use low temperature techniques such as electroplating with thin wafers, the vias must normally have large diameters to achieve uniform internal coverage by insulating or conductive layers, small diameter vias require thinning the wafers.

A need exists in the industry to fabricate high aspect ratio, small diameter through-wafer vias in relatively thick substrates to enable parallel layer processing, known-good-die testing, and either die-level or wafer-level assembly. A further need exists in the industry for fabricating through-wafer, small diameter vias at low temperatures. A still further need exists for a process to uniformly coat small diameters vias.

SUMMARY OF THE DISCLOSURE

Embodiments of the present invention are directed to a method for forming small diameter vias at low temperatures, and devices fabricated using such methods. In preferred embodiments, through-substrate vias are fabricated by forming a through-substrate via hole; forming an insulated layer on the interior surface of the via; and depositing conductive material into the via by means of a flowing solution plating technique. The flow of this solution may be facilitated by the use of plating chemistries wherein the plating reaction releases a gas that pushes the conductive material solution through the via to facilitate plating the via with the conductive material. In preferred embodiments, the fabrication of the substrate is conducted at low temperatures.

The substrate fabricated by using such methods has first and second surfaces, comprising a first plurality of substantially cylindrical cavities formed into the first surface to first depths and having first diameters; a second plurality of substantially cylindrical cavities formed into the second surface to second depths greater than said first depths and having second diameters greater than said first diameters; and said first and second plurality of cavities being coated with an insulating layer and a conductive material and being mutually aligned to form a plurality of continuous conductive vias through said substrate.

A feature of embodiments of the invention is the formation of small diameter through-substrate vias. An advantage of this feature is that a higher density of vias can be formed on a single substrate, thus allowing more circuitry to be included on a single substrate.

A further feature of embodiments of the invention is that the through-substrate vias can be fabricated at low temperatures. An advantage to this feature is that the formation of the vias does not damage circuitry contained within the substrate.

A still further feature of embodiments of the invention is that the activation of the isolation layer provides for conformal layers of conductive material. An advantage to this feature is that the substrate is uniformly coated with conductive material which enhances the performance of the chips.

Another feature of embodiments of the invention is that it provides a method for forming small-diameter, fine-pitch vias in relatively thick substrates to enable parallel layer processing, known-good-die testing, and either die-level or wafer-level assembly. An advantage to this feature is that the use of a thicker wafer maintains the mechanical integrity of the wafer to minimize breakage during processing and use. A further advantage to this feature is that it avoids the need for sequential bonding and thinning operations and offers capabilities not possible in conventional technologies.

BRIEF DESCRIPTION OF THE DRAWINGS

The detailed description of embodiments of the invention will be made with reference to the accompanying drawings, wherein like numerals designate corresponding parts in the figures.

DETAILED DESCRIPTION OF PREFERRED EMBODIMENTS

Embodiments of the present invention are directed to a process for fabricating high aspect ratio through-wafer vias at low temperatures. The fabrication process produces high performance silicon chips or CMOS assemblies having high density via interconnects.

Figure 1:
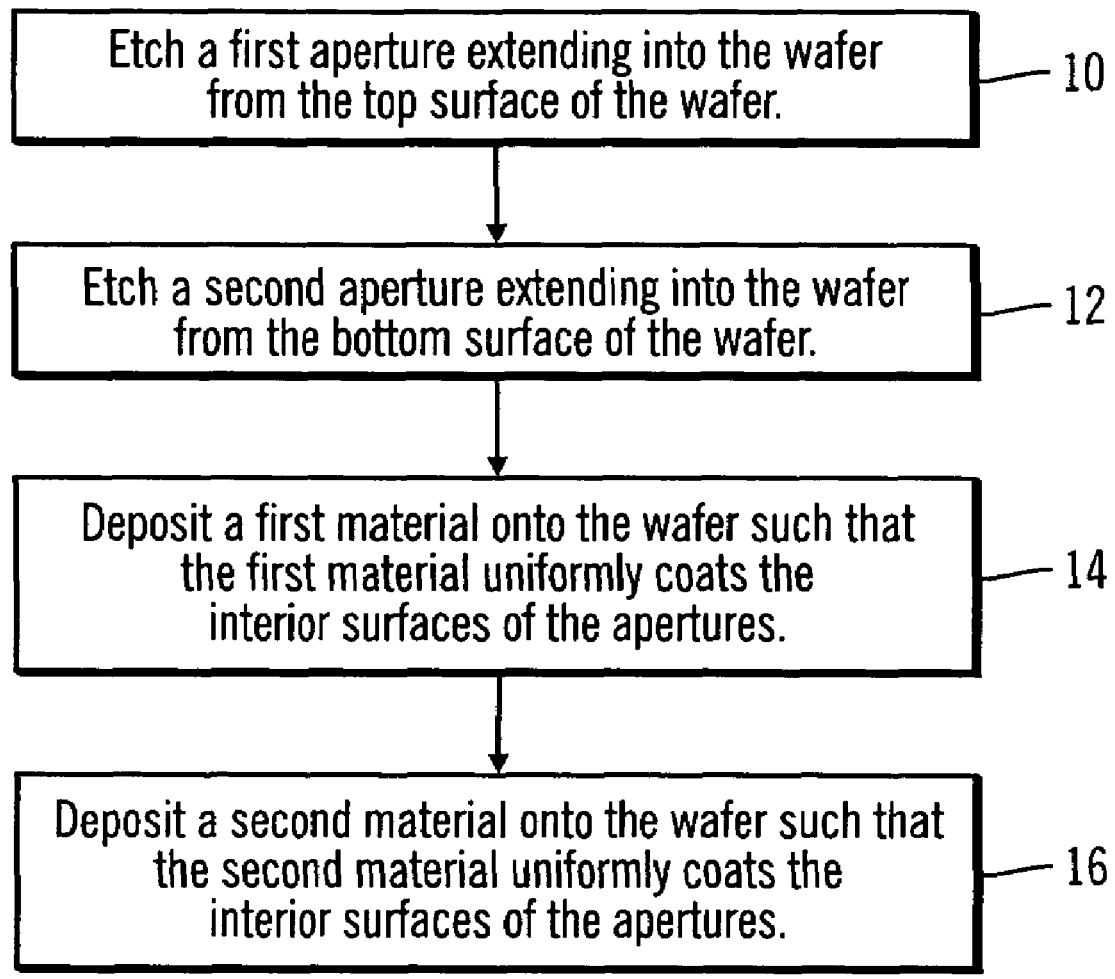
FIG. 1 is a block diagram of a process for forming high aspect ratio, through-wafer vias in accordance with an embodiment of the invention.

With reference to FIG. 1, in preferred embodiments, to form a via, a first cavity is etched into the first surface of a wafer 10. After the first cavity is formed, a second cavity is etched into the second surface of the wafer 12. Once the first and second cavities are formed, a first material is deposited onto the wafer such that it uniformly coats the wafer 14, including uniformly coating the interior walls of the cavities. Finally, a second material is deposited onto the wafer such that the second material uniformly coats the wafer 16, including the interior walls of the cavity.

Figure 2:
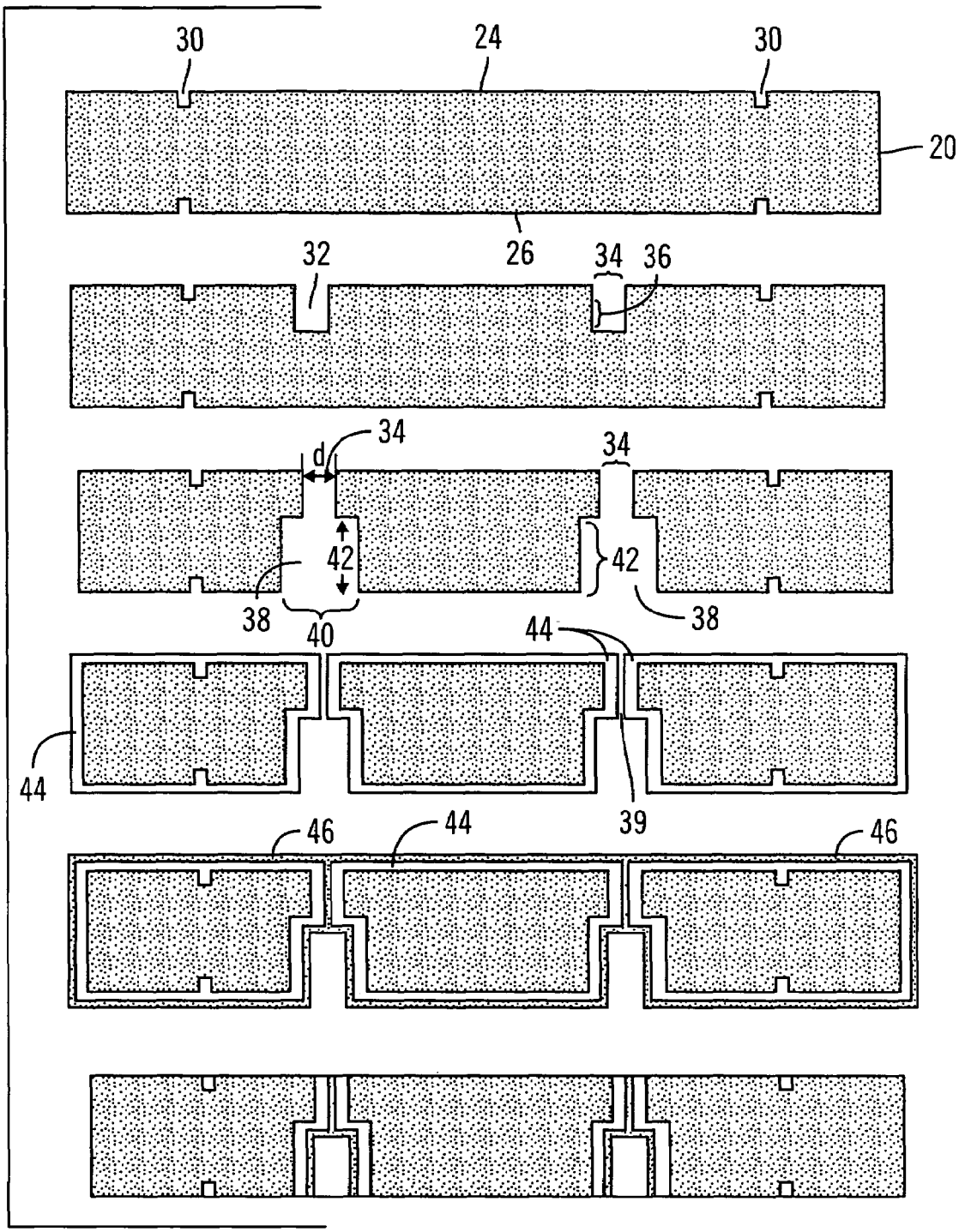
FIG. 2 is a schematic of the process for forming high aspect ratio, through-wafer vias in accordance with the embodiment of FIG. 1.

With reference to FIG. 2, the wafer 20, also referred to as a substrate, comprises a first surface 24, a second surface 26 and a depth d. In preferred embodiments, the circuitry is disposed in a first portion of the wafer 27 nearer the second surface than the first surface. The circuitry will depend, of course, on the purpose of the final product. In preferred embodiments, the wafer is made from silicon. However, the wafer can be formed from any suitable material, including, but not limited to, gallium arsenide or indium phosphate.

FIG. 2 depicts a series of cross-sectional views of the wafer during various stages of the overall process generally described in FIG. 1. Referring to FIG. 2, prior to fabricating the vias, alignment marks 30 are etched on the first 24 and second 26 surface of the wafer 20. The alignment marks facilitates alignment of the wafer during the creation of different layers to ensure proper formation of the chip. Once the alignment marks have been etched into the wafer 20, a first cavity 32 is etched into the first surface 24. The first cavity, also known as a via, has a first diameter 34, and extends a first depth 36 into the wafer 20. In preferred embodiments, the first cavity has a diameter of 4 µm and extends to a first depth between 50 µm-80 µm. In preferred embodiments, the first diameter 34 can range between 0.5 µm-300 µm, and the first cavity can extend to a first depth between 10 µm-200 µm. Generally, the first depth 36 does not extend laterally into the portion of the wafer 27 containing the circuitry, and will extend in depth to below the portion of the wafer containing active circuitry.

A second cavity 38, also known as a via, having a second diameter 40, is etched coaxially with the first cavity 32 into the second surface 26 of the wafer and extends a second depth 42 into the wafer 20. The second cavity 38 has a diameter of 8 µm to 20 µm and extends to a second depth of 200 µm. In preferred embodiments, the second diameter 40 can range from 0.5 µm to 300 µm, and the second cavity can extend to a second depth ranging from 50 µm-1500 µm.

Figure 3:
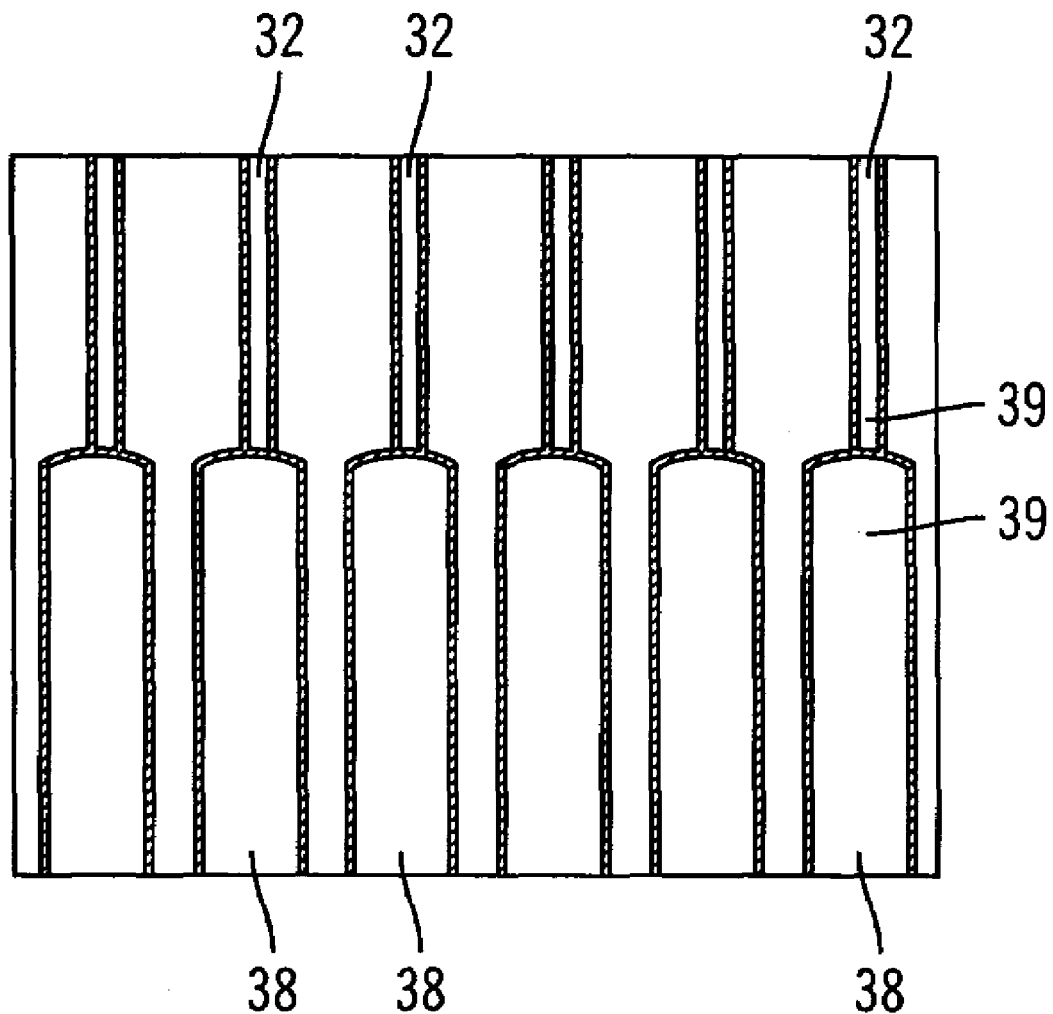
FIG. 3 is an enlarged cross-sectional view of the etched vias formed in accordance with the process of FIG. 1.

The second cavity 38 is etched to a second depth such that it communicates with the first cavity 32 to form a continuous aperture 39 through the entire thickness of the wafer. FIG. 3 depicts a cross section of the continuous aperture 39 formed by the first cavity 32 and the second cavity 38.

Embodiments of the invention produce high aspect ratio first and second cavities having small diameters. The high aspect ratio cavities are achieved via an etching process known as the Bosch process for Deep Reactive Ion Etching ("DRIE") in Si, although any etching process which can produce high aspect ratio, small diameter cavities would also be suitable.

Figure 4:
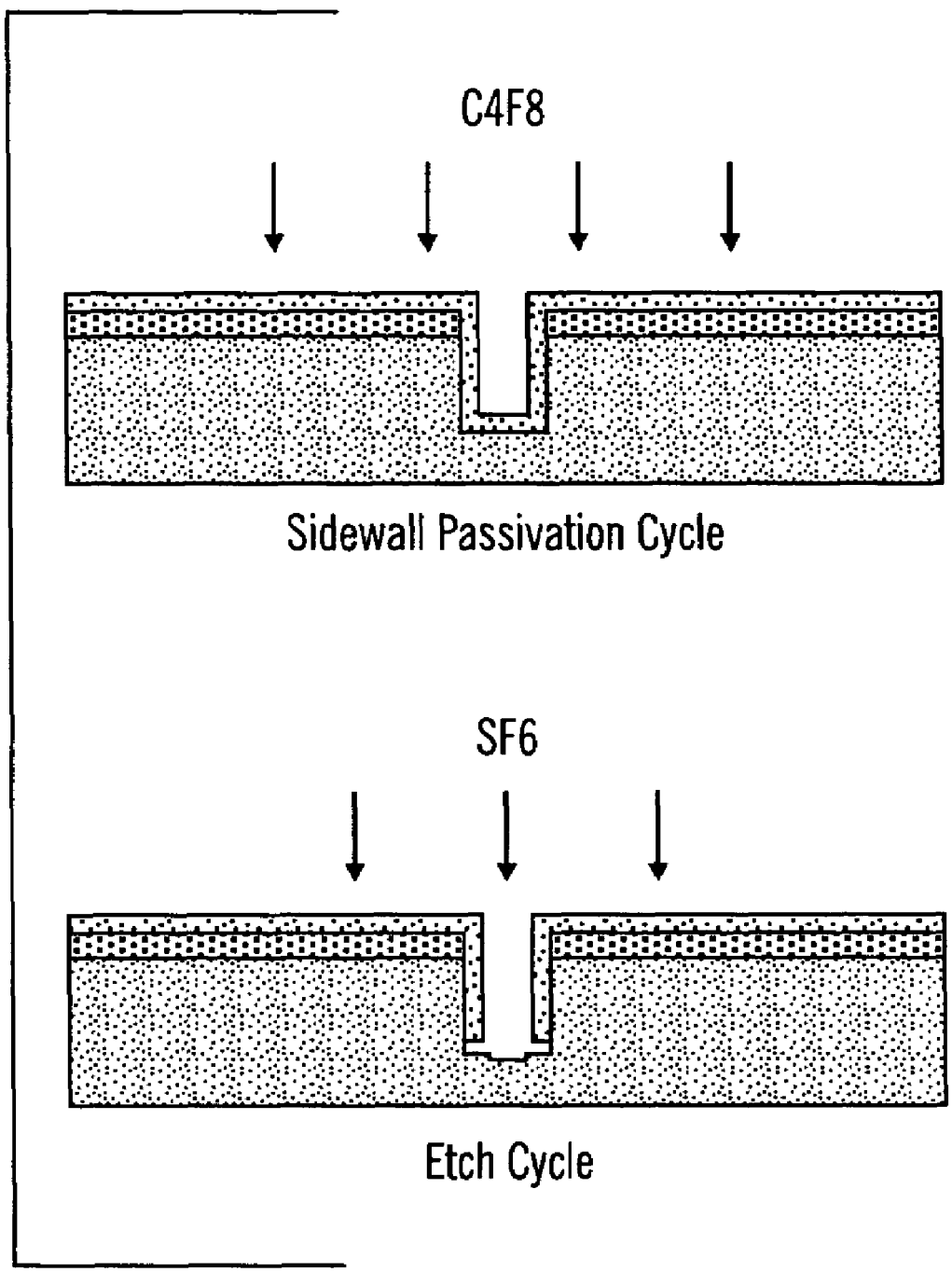
FIG. 4 is a schematic of the etching process to form the vias in accordance with the embodiment of FIG. 1.

Overall, as is well known by those skilled in the art, the DRIE process utilizes alternating etch and passivation steps. With reference to FIG. 4, an etchant, such as, sulfur hexafluoride $SF_6$ is used to etch a portion of the cavity into the wafer. To passivate the side wall of the cavity and prevent further lateral etching, an insulating layer is subsequently deposited using a separate gas composition, including species such as octafluorocyclobutane $C_4F_8$. The process then repeats until the desired depth is achieved. As this process is well known by those skilled in the art, a more detailed description will not be set forth. In preferred embodiments, the etching process is conducted at temperatures below 100° C. In still other preferred embodiments, the etching process is conducted at temperatures below 400° C. As discussed above, low temperatures are any temperatures that do not damage the existing circuitry.

Etching via the Bosch process allows for etching with high selectivity and achieves substantially vertical side walls. Indeed, the Bosch process produces a high aspect ratio via of 40:1. This high aspect ratio facilitates the production of smaller diameter cavities as it reduces the amount of lateral blooming during etching and reduces side wall scalloping.

With reference again to FIG. 2, once the continuous aperture 39 has been formed, a first material 44 is deposited onto the wafer. In preferred embodiments, the first material 44 is a dielectric or a non-electrically conductive material, such as parylene, silicone dioxide derived from precursors such as tetra-ethyl ortho silicate ("TEOS"), aluminum oxide or other inorganic oxides or insulating organic films. The first material 44 forms an isolation layer that is conformal and uniformly covers the sidewalls of the cavities. The uniform coverage of the sidewalls with the first material 44, or isolation layer, electrically isolates the cavities from the substrate and from the other cavities.

To uniformly deposit the first material 44, in preferred embodiments, the first material is deposited via vapor-deposition. In preferred embodiments, the vapor-deposition is conducted at temperatures below room temperature, for example, below 25° C., although temperatures between 20° C. and 200° C. are also suitable.

Figure 5:
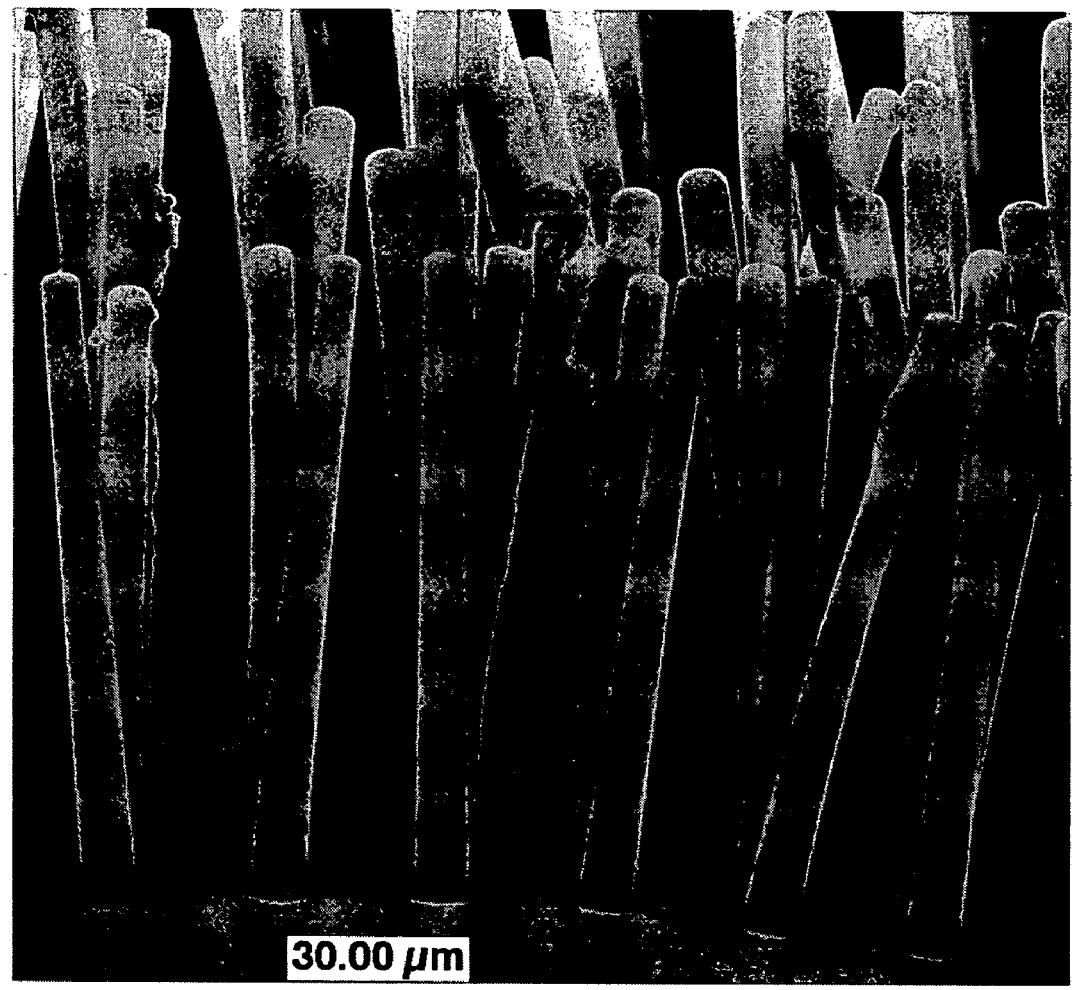
FIG. 5 is a photomicrograph of a portion of the isolation layers formed during the deposition of the materials onto the wafer which have been exposed by removing the surrounding wafer material.

As stated above, in some embodiments, the first material is parylene. Parylene vapor-deposition is conformal and thus, produces uniform coverage of the wafer, including the interior walls of the small diameter cavities. The achievement of uniform, conformal coverage by the parylene vapor-deposition has been confirmed in deep cavities, for example, cavities ranging from 350-450 μm. FIG. 5 depicts a portion of a dissolved wafer which exposes the cavity shells formed from parylene. As illustrated in FIG. 5, the shape of the cavity shell is fully formed and evinces the coverage of the parylene throughout the interior of the cavity of a given depth.

In addition to parylene vapor-deposition, other techniques that provide for uniform and conformal coverage are also suitable, such as atomic layer deposition ("ALD") using an aluminum oxide non-conductive ceramic, plasma enhanced chemical vapor deposition tetraethyl silicon dioxide ("PECVD TEOS"), and Bosch passivation coating. As these techniques are well known to those skilled in the art, a detailed discussion regarding these techniques will not be set forth.

After the first material 44 has been deposited onto the wafer, a second material 46, comprising an electrically conductive material, is deposited onto the first material 44. In preferred embodiments, prior to the deposition of the second material 46, the first material 44 is activated. Activating the first material, for example, an isolation layer, makes the first material more conducive to receive the second material 46. Once the first material is activated, the second material 46 is deposited onto the activated first material 44. The second material 46 uniformly covers the wafer, including the interior walls of the cavities, and metallizes the wafer.

Various techniques for activating the first material and depositing the second material can be used. For instance, in one embodiment, assuming a first material of parylene, the parylene is activated via the application of an oxygen plasma. The parylene is exposed to the oxygen plasma for approximately 3-5 minutes. The exposure to the oxygen plasma roughens the surface of the parylene and causes hydrophobic surfaces to become hydrophilic. The transformation of the surface from hydrophobic to hydrophilic causes the surface to become a wetable surface that will spread aqueous materials applied to the surface and uniformly coat the surface with the applied materials. Thus, the application of the second material 46 to the activated parylene surface will cause the second material to spread and uniformly coat the wafer, including the interior walls of the cavities. In some embodiments, the second material completely fills the cavities as illustrated in FIG. 2. Activation by other suitable plasmas may also be used, including, but not limited to, an argon plasma.

In another embodiment, activation of the isolation layer is achieved by the application of a seed layer that causes a reaction with the second material 46 when it is applied to the wafer. For instance, in one embodiment, a two-part tin-palladium (Sn/Pd) technique is used to deposit a seed layer onto the first material. In this example, the seed layer facilitates plating of the metal conductor (such as nickel) onto the insulating material. In this two-part process, tin is adsorbed on the parylene by bathing the wafer with the parylene in a solution of stannous chloride (tin) and hydrochloric acid. The solution causes the tin ions $Sn^{2+}$ to be adsorbed onto the surface of the insulator, e.g., parylene. Next, the wafer is bathed in a solution of palladium chloride and hydrochloric acid which reduces the solution and causes the deposition of palladium on the surface. The reduced solution leaves a monolayer of palladium on the tin. The second material 46, such as nickel, will react with the monolayer of palladium and plate the wafer. Other techniques for applying a seed layer can be used and are well known by those skilled in the art. For example, the seed layer can be applied using a solution containing a metal acetate. In this technique, a solution containing a metal acetate, such as palladium acetate, is bathed over the substrate and through the vias to cause coating on the interior surfaces of the vias. The application of heat to the coating causes the deposition of a thin metal layer on the interior surface of the vias. The above described seed deposition and plating techniques can be applied in the plating of any structure, for example, a circuit board, and is not limited to the plating of vias and wafers.

After the first material 44 has been activated, the second material 46 is deposited on the activated first material. Various techniques can be used to deposit the second material 44. However, for effective metallization of the cavities, it is preferable for the second material 46 to be deposited uniformly, including uniform deposition into the cavities. In preferred embodiments, flowing solution plating techniques are used. For instance, in one embodiment, an electroless deposition process is used to deposit the second material 46. In this embodiment, the second material 46 is nickel, but other materials may be used. The wafer is bathed in a nickel solution such that the nickel flows over the wafer and fills the cavities. Assuming activation of the parylene based on the approaches discussed previously, the nickel solution reacts with the activated parylene and causes the release of hydrogen. The release of the hydrogen pushes the nickel through the cavities and allows the cavities to remain clear, thereby allowing the nickel to plate the entire cavity through the wafer despite the small diameters. The process is complete when hydrogen is no longer released. In this embodiment, the nickel plating is performed at 85° C. Other flowing solution techniques can also be used where the solution flow is created by other sources. For instance, the flow of the solution can be created by a mechanical agitation of the solution, or pressurization of the solution. In addition to flowing plating techniques, the deposition of the second material, can include, but is not limited to, chemical vapor deposition and atomic layer deposition techniques to deposit conductive materials (which may include metals, ceramics, or polymers).

With reference again to FIG. 2, once the second material has been deposited on the wafer, the wafer is polished on the first and second surfaces 24, 26. In an alternative embodiment, removal of the seed layer on the planar surfaces of the wafer can provide selective plating only in the interior surfaces of the via holes, which would eliminate the need for a surface polishing. In either approach, a subsequent surface plating using a noble material (such as Au) can reduce surface oxide formation and facilitate subsequent electrical interconnection to the via. Any final connections required to be made via interconnects formed by the cavities are completed and the wafers are then ready for use. Although the foregoing described the invention with preferred embodiments, this is not intended to limit the invention. Indeed, embodiments of this invention can be combined with other circuit chips and systems. For instance, embodiments of the invention can be used for compact electronic circuits with multiple stacking layers and circuitry, or a MEMS wafer-scale packaging, such as an RF switch. Still other uses includes an enhanced three-dimensional electronic imager having wide dynamic range and pixel level image processing due to the density of the vias on the wafer. Yet another application includes a vertically interconnected sensor array which provides signal processing in conjunction with infrared sensor systems, use with an arrayed acoustic sensing system, LADAR, and microprocessor circuits in which latency across the chip presents an issue.

As seen from the foregoing, the wafers having high aspect ratio through-wafer vias are intended to be used as stand alone wafers or in combination with other types of wafers or systems. In this regard, the foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A process for fabricating a through-wafer via through a semiconductor wafer on which active circuitry has been fabricated, the wafer having a first surface and a second surface, comprising:
    forming a through-wafer via hole into a semiconductor wafer on which active circuitry has been fabricated;
    forming an isolation material directly onto the wafer and onto the interior semiconductor walls of said through-wafer via hole, said isolation material being electrically insulating, continuous and substantially conformal;
    preparing the isolation material for receiving a conductive material such that the conductive material will react with the isolation material to plate the via; and
    depositing conductive material into the via hole over said isolation material such that it is electrically continuous across the length of said via hole, said conductive material deposited by means of an electroless flowing solution plating process.

2. A process as claimed in claim 1, wherein forming the through-substrate via, forming isolation material, and depositing conductive material are performed at a low temperature range.

3. A process as claimed in claim 2, wherein said low temperature range is less than 100° C.

4. A process as claimed in claim 2, wherein said low temperature is less than 400° C.

5. A process as claimed in claim 1, wherein said isolation material is formed onto said substrate via by a process selected from the group consisting of vapor-deposition of organic materials, atomic layer deposition, plasma enhanced chemical vapor deposition, and polymer passivation coatings derived from substrate etch processing.

6. A process as claimed in claim 1, wherein the isolation material is prepared by activating it with a seed layer which reacts with the conductive material and thereby promotes said electroless deposition.

7. A process as claimed in claim 1, further comprising:
    forming a plurality of vias into the substrate; and
    plating said plurality of vias by said electroless flowing solution plating process.

8. A process as claimed in claim 1, wherein the depth of the vias is greater than 100 μm.

9. A process as claimed in claim 1, wherein said through-substrate via is formed by:
    etching a first cavity into the first surface of the substrate with a first diameter; and
    etching a second cavity into the second surface of the substrate with a second diameter, wherein the first and second cavities form a single continuous aperture through the substrate.

10. A process as claimed in claim 9, wherein said first and second cavities extend to depths in the range of 20 μm-200 μm and 100 μm-350 μm, respectively.

11. A process as claimed in claim 10, wherein said first and second diameters are in the range of 2 μm-8 μm and 6 μm-25 μm, respectively.

12. A process as claimed in claim 9, wherein said first and second cavities are etched by a deep reactive ion etching process.

13. A process as claimed in claim 1, wherein the reaction to deposit the conductive material releases a gas that pushes the conductive material solution through the via to facilitate plating the via with the conductive material.

14. A process as claimed in claim 1, wherein a solution flow is generated by mechanical agitation to facilitate plating with the conductive material.

15. A process as claimed in claim 1, wherein the isolation material is an organic isolation material which is prepared by activating it with a seed layer that reacts with the conductive material, said seed layer being deposited at low temperatures by atomic layer deposition or chemical vapor deposition.

16. The process of claim 1, wherein said organic isolation material is parylene.

17. A process for fabricating a through-substrate via, the substrate having a first surface and a second surface, comprising:

forming a through-substrate via hole into the substrate;
forming an isolation material onto the substrate and on the interior walls of said via hole, said isolation material being electrically insulating, continuous and substantially conformal;
preparing the isolation material for receiving a conductive material;
depositing conductive material into the via hole by means of a flowing solution plating technique such that it is electrically continuous across the length of said via hole, and such that the conductive material reacts with the isolation material to plate the via;
wherein the isolation material is parylene; and
the isolation material is prepared by activating it with a plasma.

18. A process for fabricating a through-substrate via, the substrate having a first surface and a second surface, comprising:

forming a through-substrate via hole into the substrate;
forming an isolation material onto the substrate and on the interior walls of said via hole, said isolation material being electrically insulating, continuous and substantially conformal;
preparing the isolation material for receiving a conductive material;
depositing conductive material into the via hole by means of a flowing solution plating technique such that it is electrically continuous across the length of said via hole, and such that the conductive material reacts with the isolation material to plate the via;
wherein the isolation material is prepared by activating it with a seed layer which reacts with the conductive material; and
wherein the seed layer is applied by:
absorbing tin onto the isolation material by bathing the substrate in a solution of stannous chloride and hydrochloric acid; and
bathing the substrate in a solution of palladium chloride and hydrochloric acid to deposit palladium on the substrate's surface.

19. A process for fabricating a through-substrate via, the substrate having a first surface and a second surface, comprising:

forming a through-substrate via hole into the substrate;
forming an isolation material onto the substrate and on the interior walls of said via hole, said isolation material being electrically insulating, continuous and substantially conformal;
preparing the isolation material for receiving a conductive material;
depositing conductive material into the via hole by means of a flowing solution plating technique such that it is electrically continuous across the length of said via hole, and such that the conductive material reacts with the isolation material to plate the via;
wherein the isolation material is prepared by activating it with a seed layer which reacts with the conductive material; and
wherein the seed layer is applied by:
bathing the substrate in a solution containing a metal acetate such that the vias are coated with the metal acetate;
heating the solution such that the metal acetate solution forms a thin metal layer on the interior surfaces of the vias.

20. A process for fabricating a through-wafer via through a semiconductor wafer, said wafer having a first surface and a second surface and having active circuitry fabricated on said first surface, comprising:

etching a first cavity having a first diameter into the first surface of said wafer; and
etching a second cavity having a second diameter into the second surface of said wafer, wherein the first and second cavities form a single continuous aperture through the wafer, thereby forming a through-wafer via hole, said cavities arranged such that said first diameter is less than said second diameter so as to reduce the area of said first surface occupied by said via;
depositing an isolation material directly onto the wafer and onto the interior semiconductor walls of said through-wafer via hole, said isolation material being electrically insulating, continuous and substantially conformal; and
depositing conductive material into the via hole over said isolation material such that it is electrically continuous across the length of said via hole.

* * * * *